(12) United States Patent
Crespin et al.

(10) Patent No.: US 7,902,040 B1
(45) Date of Patent: Mar. 8, 2011

(54) DUAL-SIDED SUBSTRATE MEASUREMENT APPARATUS AND METHODS

(75) Inventors: Albert J. Crespin, San Jose, CA (US); Jim Woodruff, San Jose, CA (US); Ray Ellis, Fremont, CA (US); Scott Kulas, Fremont, CA (US); Joe Jamello, Saratoga, CA (US); Emily True, Pleasanton, CA (US)

(73) Assignee: Ultratech, Inc., San Jose, CA (US)

( * ) Notice: Subject to any disclaimer, the term of this patent is extended or adjusted under 35 U.S.C. 154(b) by 327 days.

(21) Appl. No.: 12/286,762

(22) Filed: Oct. 2, 2008

Related U.S. Application Data

(62) Division of application No. 10/213,868, filed on Aug. 5, 2002, now Pat. No. 7,528,937.

(51) Int. Cl.
*H01L 21/30* (2006.01)
(52) U.S. Cl. ......................................................... 438/455
(58) Field of Classification Search .................. None
See application file for complete search history.

(56) References Cited

U.S. PATENT DOCUMENTS

| 5,621,813 | A | 4/1997 | Brown et al. | 382/151 |
| 7,528,937 | B1* | 5/2009 | Crespin et al. | 355/75 |
| 7,562,686 | B2* | 7/2009 | Best et al. | 156/379 |
| 2002/0167649 | A1* | 11/2002 | Heinle | 355/53 |
| 2006/0141743 | A1* | 6/2006 | Best et al. | 438/455 |
| 2006/0172507 | A1* | 8/2006 | Best et al. | 438/455 |

* cited by examiner

*Primary Examiner* — Charles D Garber
*Assistant Examiner* — Andre' C Stevenson
(74) *Attorney, Agent, or Firm* — Allston L. Jones; Peters Verny, LLP

(57) ABSTRACT

An apparatus for measuring the relative positions of frontside and backside alignment marks located on opposite sides of a substrate is disclosed. The apparatus includes upper and lower optical systems that allow for simultaneous imaging of frontside and backside alignment marks. The frontside and backside alignment mark images are processed to determine the relative position of the marks, as a measurement of the alignment and/or overlay performance of the tool that formed the marks on the substrate.

23 Claims, 9 Drawing Sheets

DUAL-SIDED SUBSTRATE MEASUREMENT APPARATUS AND METHODS

CROSS REFERENCE

This application is a divisional application of the application having Ser. No. 10/213,868 filed on Aug. 5, 2002 now U.S. Pat. No. 7,528,937.

BACKGROUND OF THE INVENTION

1. Field of the Invention

The present invention relates to alignment metrology, and in particular to apparatus and methods for measuring alignment and/or overlay accuracy of images formed in or on a substrate.

2. Background Information

In semiconductor manufacturing, the processing steps for fabricating a semiconductor device (e.g., an integrated circuit) include exposing a substrate, such as a semiconductor wafer coated with photosensitive material, using a lithographic exposure apparatus. This exposure involves forming images at precise locations on the substrate. In one example, the substrate, which resides on a substrate stage, is aligned to a reticle residing on a reticle stage. The reticle includes a pattern of a particular device layer, as well as alignment marks. The alignment is performed using an alignment apparatus, such as that disclosed in U.S. Pat. No. 5,621,813, which patent is incorporated herein by reference.

After aligning the substrate, the reticle is illuminated with radiation and the reticle pattern is imaged in the photoresist. The exposed photoresist is then developed and the substrate etched to transfer the resist pattern to the substrate.

The region of the substrate over which the reticle is imaged is sometimes referred to an "exposure field". This alignment and exposure process can be performed on a variety of lithography apparatus, such as step and repeat, step-and-scan, contact and proximity apparatus.

Typically, the first device layer is aligned to a feature or mark on the substrate, such as a flat or notch and the substrate edge. The subsequent layers are then aligned relative to this first layer and/or to each other. "Alignment", as the term is used herein, refers to the position of the center of the exposure field relative to a reference location. "Overlay", as the term is used herein, refers to the position and orientation of the exposure field relative to an ideal exposure field, and involves measuring the position of multiple points per exposure field. Thus for example, a particular exposure field can have perfect alignment but poor overlay, e.g., if the exposure field is imaged with rotation or distortion. "Alignment mark", as the term is used herein, refers to a feature on either side of the substrate whose position can be measured to establish the degree of either alignment or overlay of a given exposure field.

To gauge the degree to which exposure fields are aligned and overlayed on the substrate, it is necessary to have the capability of making alignment and overlay measurements. This is typically accomplished by measuring the position of an alignment mark in the exposure field relative to another alignment mark or feature formed somewhere else on the substrate. By measuring alignment or overlay for a given substrate or set of substrates, adjustments can be made to the exposure tool to reduce or eliminate tool-related sources of alignment and/or overlay errors. Reducing such errors increases the likelihood that the device being manufactured by the exposure tool will perform to its specification.

Certain lithographic exposure apparatus perform exposures of the frontside of the substrate while aligning to features (e.g., alignment marks) on the backside of the substrate. Conventional apparatus and techniques for quantifying frontside to backside alignment performance involve measuring two marks at two widely separated points on the frontside of the substrate in relation to two corresponding backside marks. This typically involves viewing the alignment marks on the backside through the frontside of the substrate using, e.g., a single optical system operating with infrared light. However, this measurement technique cannot accurately measure mask (reticle) run-out or stepping-grid errors. Thus, the actual alignment performance over the entire substrate is not always properly characterized by conventional apparatus and techniques. Further, not all substrates are transparent enough to allow for both sides to be viewed by a single optical system positioned on one side of the substrate.

What is needed therefore are alignment apparatus and method for providing a more accurate characterization of alignment and overlay performance of an exposure tool.

SUMMARY OF THE INVENTION

A first aspect of the invention is an apparatus that includes a stage assembly capable of movably supporting a substrate. The substrate has a frontside with frontside alignment marks and a backside with backside alignment marks. An upper optical system is movably arranged above the stage assembly and the frontside of the substrate so as to be in optical communication with the frontside of the substrate to form an image of one or more of the frontside alignment marks. A lower optical system is arranged relative to the upper optical system and beneath the stage assembly so as to be in optical communication with the backside of the substrate to form an image of one or more of the backside alignment marks. The images of the frontside and backside alignment marks are captured by a frame grabber coupled to the upper and lower optical systems. The images are then processed (e.g., in a central processing unit connected to the frame grabber) to determine the relative positions (i.e., the alignment) of the alignment marks, and hence the quality of the alignment and/or overlay performance of the tool that formed the alignment marks on the substrate.

A second aspect of the invention is a method of measuring a substrate having a frontside with frontside alignment marks and a backside with backside alignment marks. The method includes capturing a first image of a select frontside alignment mark with a an upper optical system arranged adjacent the frontside of the substrate. The method also includes capturing a second image of a select backside alignment mark with a lower optical system arranged adjacent the backside of the substrate and aligned relative to the upper optical system. The method also includes processing the first and second images to determine a lateral offset between the select frontside and backside alignment marks.

DETAILED DESCRIPTION OF THE INVENTION

In the following detailed description of the embodiments of the invention, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 1:
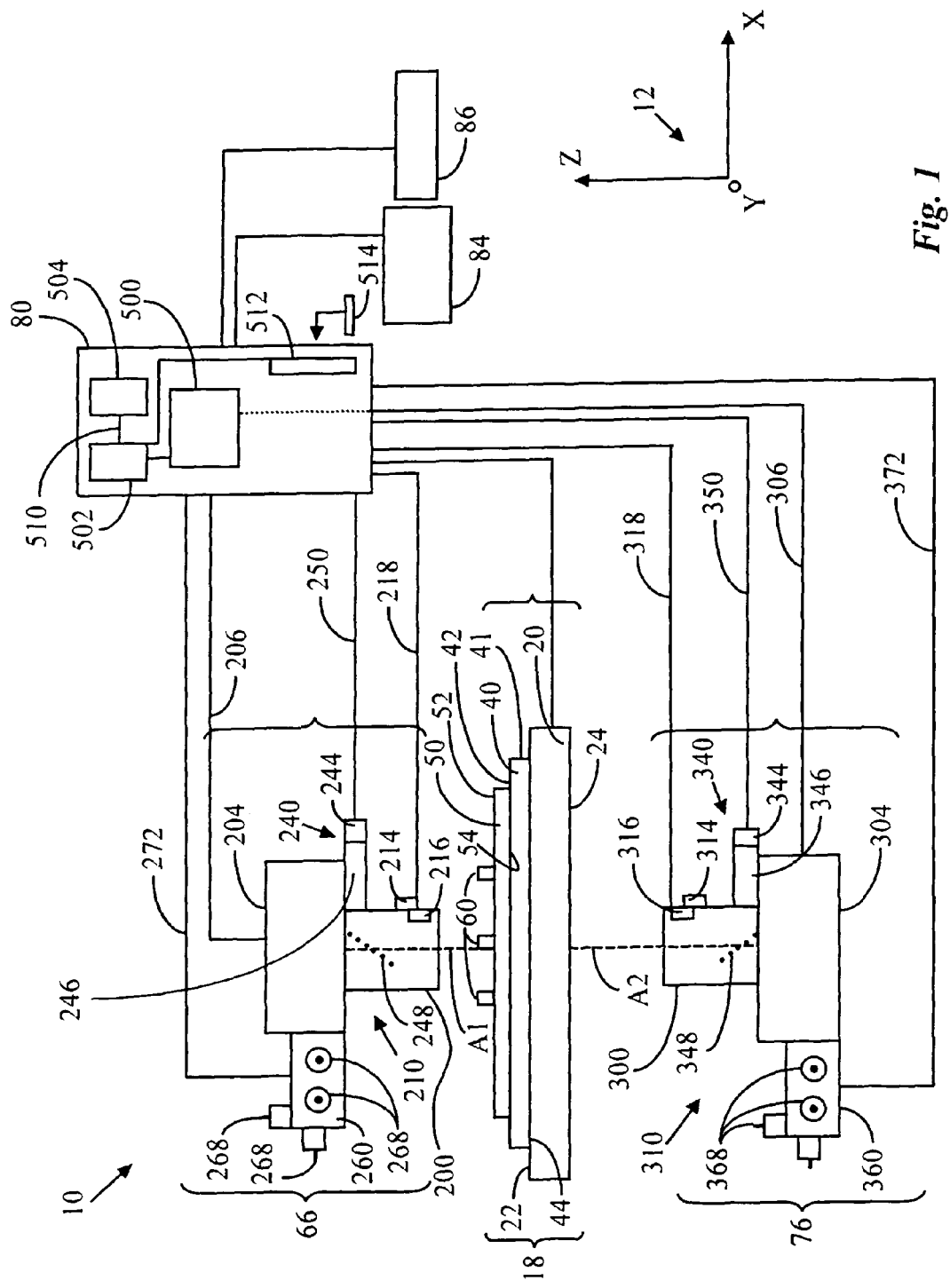
FIG. 1 is a schematic diagram of an embodiment of the dual-sided alignment metrology apparatus of the present invention.

FIG. 1 is a schematic diagram of an example embodiment of a dual-sided measurement apparatus 10 according to the present invention. A coordinate system 12 is shown for reference. Apparatus 10 is referred to as "a measurement apparatus" for the sake of simplicity. It will be understood by those skilled in the art that the apparatus is capable of performing alignment and overlay measurements as described below.

An overview of apparatus 10 and its main components is first provided. Then each of the main apparatus components is discussed in greater detail, along with methods of using the apparatus for measuring a substrate.

Apparatus Overview

Alignment apparatus 10 has a stage assembly 18 that includes a substrate stage 20 with an upper surface 22 and a lower surface 24. In an example embodiment, substrate stage 20 is capable of moving in at least the X-direction, the Y-direction and the $\theta_Z$ direction. Stage assembly 18 further includes a platen 40 (also referred to as a "chuck") arranged above (e.g., atop) substrate stage upper surface 22. Platen 40 has a periphery 41, an upper surface 42 and a lower surface 44. Platen upper surface 42 is capable of supporting a substrate 50 having a frontside 52 and a backside 54. In an example embodiment, platen 40 is transparent to select wavelengths of radiation so that backside 54 can be viewed through the platen.

Figure 2:
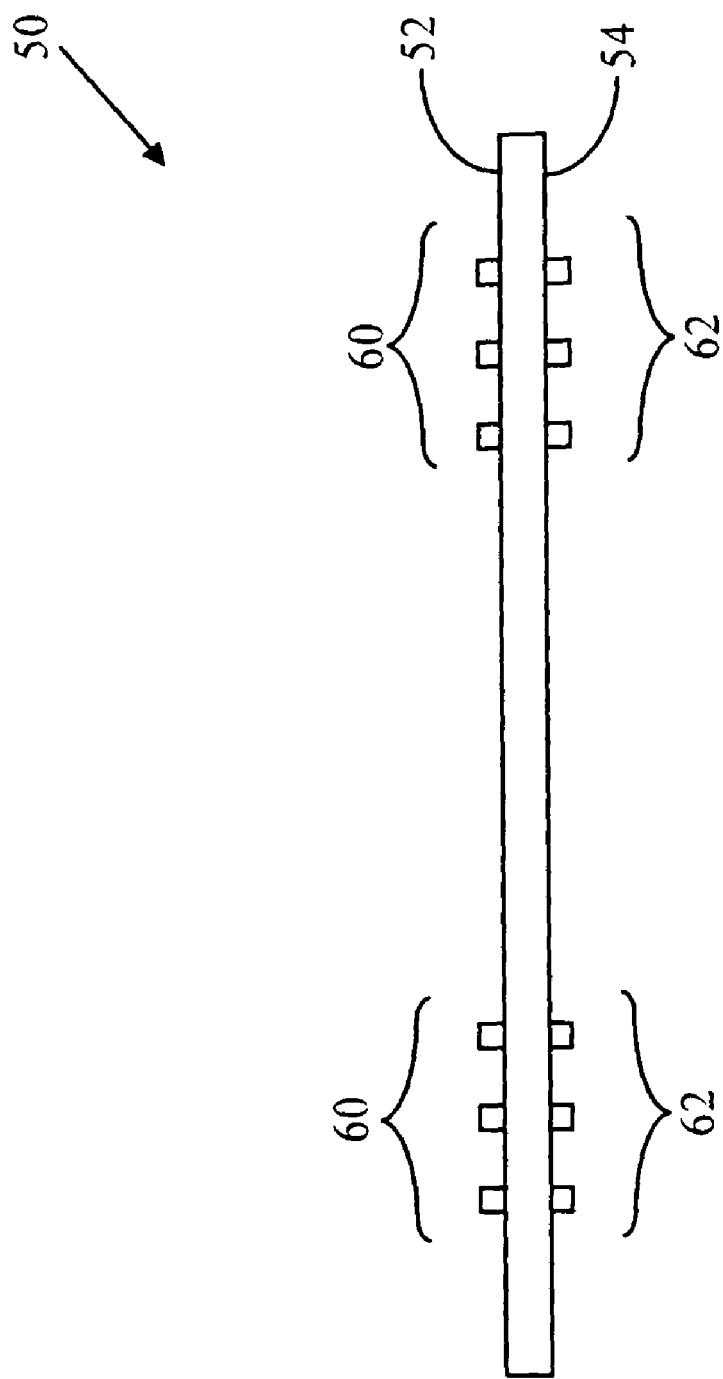
FIG. 2 is a side view of a substrate having frontside and backside alignment marks.

FIG. 2 is a side view of an example substrate 50. Substrate 50 includes front-side alignment marks 60 on frontside 52 and corresponding backside alignment marks 62 (not shown in FIG. 1) on backside 54. In an example embodiment, frontside and backside alignment marks have a size on the scale of microns or tens of microns.

With reference again to FIG. 1, residing above (i.e., adjacent) substrate frontside 52 (or platen upper surface 42 when the substrate is absent) is an upper optical system 66 with an axis A1. Residing beneath (i.e., adjacent) substrate backside 54 (or platen lower surface 44 when the substrate is absent) is a lower optical system 76 with an axis A2. In an example embodiment, a controller 80 controls the operation of apparatus 10 and/or processing information therefrom coupled to at least one of upper optical system 66, lower optical system 76, and stage assembly 18. Further in an example embodiment, a display 84 and an input device 86 are coupled to controller 80.

Stage Assembly

Figure 3:
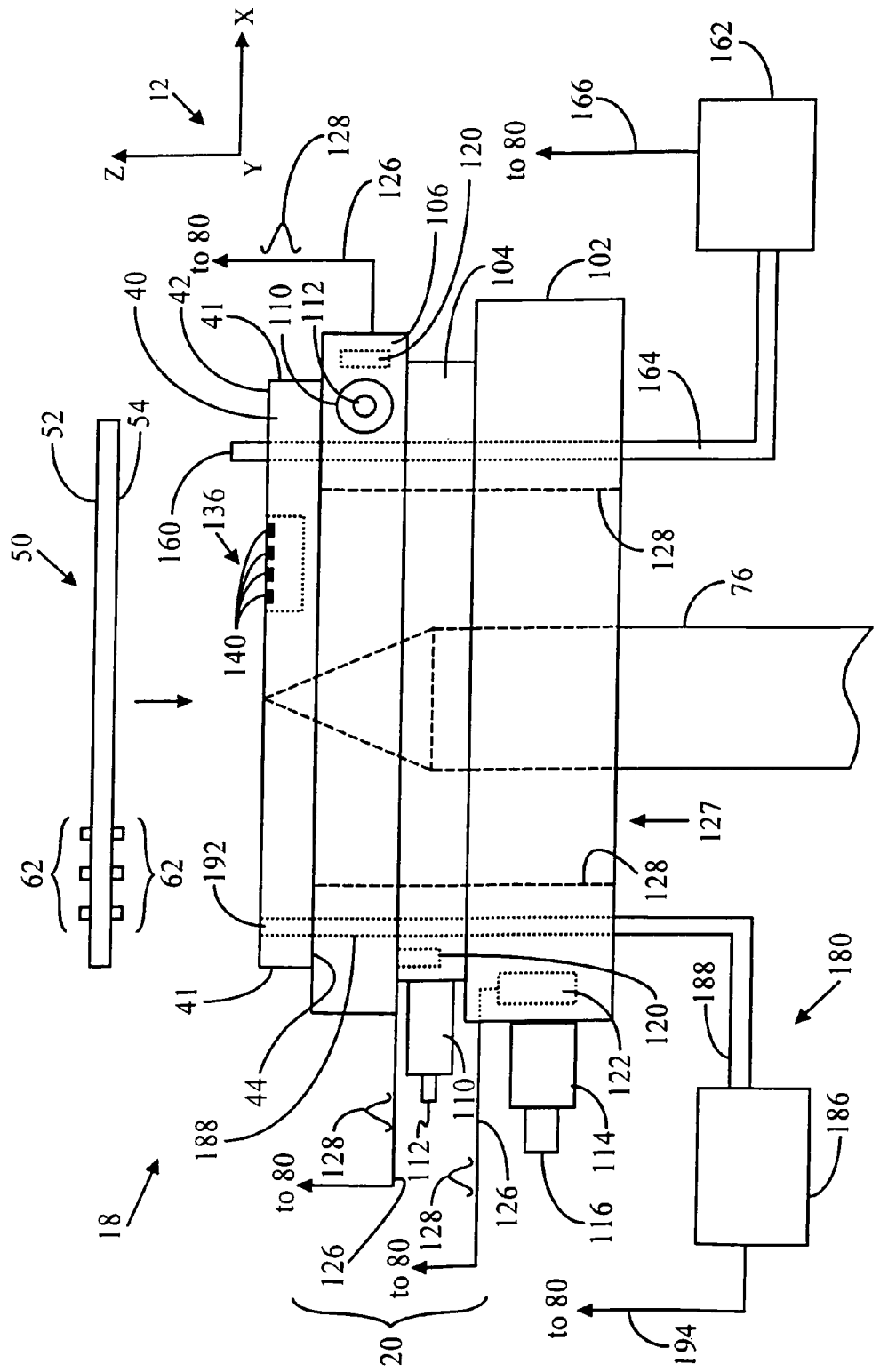
FIG. 3 is a close-up side view of an embodiment of the stage assembly of the apparatus of FIG. 1.

FIG. 3 is a detailed side view of stage assembly 18. The various components of stage assembly 18 are discussed separately below.

Translation Stages and Platen

In an example embodiment, stage assembly 18 includes a rotation ("theta") stage 102 upon which is mounted an X-translation stage 104 and a Y-translation stage 106. It is easier to rotate the image if rotation stage 102 is tied to ground and its alignment axis is aligned to the microscope axes A1 and A2. With this arrangement, the rotation of substrate 50 is always centered in the field of view of the upper or lower optical system no matter what part of the substrate is being viewed. In practice, stages 102, 104 and 106 can be arranged in any order along the Z-direction. In an alternate example embodiment, the rotation stage can be eliminated and the substrate can be manually rotated on the platen.

In an example embodiment, X- and Y-translation stages 104 and 106 each include a coarse linear position control knob 110 and a fine position control knob 112. Further, rotation stage 102 includes coarse and fine angular position control knobs 114 and 116. Control knobs 110 and 112 are coupled to respective drive mechanisms 120 that drive the movement of the X- and Y-translation stages in response to movement of the control knobs. Likewise, control knobs 114 and 116 are coupled to a drive mechanism 122 that drives the angular movement of rotation stage 102.

In an alternate example, the control knobs for the rotational drive mechanism 122 can be eliminated and rotation can be achieved by manually rotating rotation stage 102 between marked positions or hard stops 180 degrees apart.

In an example embodiment, coarse linear position control knobs 110 are capable of tenth millimeter resolution (e.g., 25 mm per revolution of the knob), and fine position control knobs 112 are capable of 0.1 micron resolution. Further in an example embodiment, angular control knobs 114 and 116 are capable of producing a 180 degree rotation within a ½ degree angular resolution.

In an example embodiment, one or more of control knobs 110, 112, 114 and 116 are manually operable to adjust stage assembly 18 to control the movement and position of platen 40 and substrate 50 residing thereon.

In another example embodiment, drive mechanisms 120 and 122 are coupled to controller 80 via signal lines 126, to automatically adjust stage assembly 18 to control the movement and position of platen 40 and substrate 50 residing thereon. This is accomplished by controller 80 providing a drive signal 128 over at least one of lines 126. In example embodiments, lines 126 and the other lines connected to controller 80 as described below are either electrical wires or optical fibers, and the signals transmitted over the lines are either electrical or optical signals.

In an example embodiment, substrate stage 20 of stage assembly 18 has a range of motion that allows upper optical system 66 to optically communicate with any point on frontside 52 of substrate 50, and that allows lower optical system 76 to optically communicate with any point on backside 54.

Further in an example embodiment, substrate stage 20 is capable of providing 180° rotation about any point on substrate frontside 52 or substrate backside 54. An advantage of such capability is that an alignment mark can be imaged and rotated without the image leaving the field of view of the particular optical system. The ability to image and measure an alignment mark at different orientations allows for the measurement and reduction or elimination of orientation-dependent errors. This in turn provides apparatus 10 with improved measurement capability.

Stage assembly 18 must permit backside alignment marks 62 to be viewed by lower optical system 76. Accordingly, in one example embodiment substrate stage 20 includes an aperture 127 (the inner walls of which are illustrated by dashed lines 128 in FIG. 3) through which backside 54 of substrate 50 can be viewed by lower optical system 76.

Likewise, platen 40 residing atop substrate stage 20 must permit lower optical system 76 to view backside alignment marks 62 on substrate 50. Thus, in an example embodiment, rather than having an aperture formed therein, platen 40 is transparent to provide a clear view of substrate backside 54 by lower optical system 76, while also providing support for substrate 50. In an example embodiment, platen 40 is made from optically flat glass to minimize imaging errors (e.g., distortion) when imaging backside alignment marks 62.

Calibration Fiducial

Figure 4:
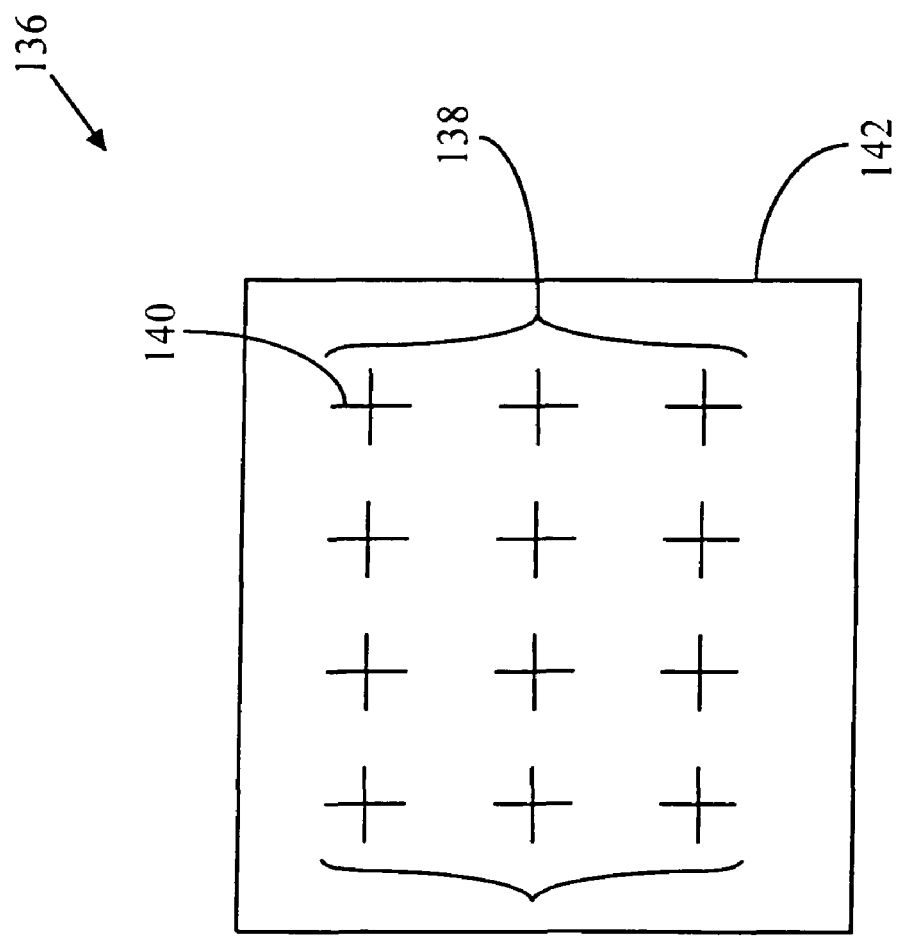
FIG. 4 is a plan view of an embodiment of the calibration fiducial used to calibrate the apparatus of FIG. 1.

In an example embodiment, apparatus 10 is calibrated to ensure the highest level of measurement accuracy. FIG. 4 is a plan view of a calibration fiducial 136 used in an example embodiment to calibrate apparatus 10, as described in greater detail below.

Calibration fiducial 136 includes an array 138 of reference marks 140 formed on a substrate 142. In an example embodiment, reference marks 140 are preferably arranged over substrate 142 to cover 80% or greater of the fields of view of the upper and lower optical systems 66 and 76. In example embodiments, reference marks 140 are opaque or semi-opaque. Further in an example embodiment, reference marks 140 are formed from a metal such as chrome, and substrate 142 is made from a transparent or semi-transparent material, such as glass (e.g., fused silica).

In one example embodiment, calibration fiducial 136 is included in platen 40, in the plane of surface 42 as illustrated in FIG. 3. The calibration fiducial is arranged such that reference marks 140 can be imaged by both upper and lower optical systems 66 and 76. Alternatively the calibration fiducial can be constructed on a separate glass substrate and placed on the platen for calibration.

In an additional example embodiment, reference marks 140 are located on both sides of substrate 142 but in this case the top and bottom targets have to be in near perfect alignment and the calibration fiducial must be constructed on a separate substrate and placed on the platen.

Alignment Pins

With reference again to FIG. 3, in an example embodiment stage assembly 18 further includes alignment pins 160 that are extendable through upper surface 42 of platen 40 to assist in positioning substrate 50 in X, Y and rotation on the upper surface of the platen. Alignment pins 160 are coupled to a pin driver 162 via a coupling conduit 164 (only one conduit is shown). Pin driver 162 is coupled via line 166 to controller 80, which controls the extension and retraction of pins 160. In the retracted state, pins 160 are flush with or lie below platen upper surface 42. In an example embodiment, pin driver 162 is an air or vacuum pump and coupling conduit 164 is an air or vacuum line. In an alternate example embodiment, the pins can be manually placed or removed at different locations to adapt to different substrate sizes and types, and they need not be retractable if they are arranged to clear upper optical system 66.

Vacuum Substrate Securing System

With continuing reference to FIG. 3, stage assembly 18 also includes a vacuum substrate securing system 180 for securing substrate 50 to platen 40. System 180 includes a vacuum pump 186 and vacuum lines 188 (only one vacuum line is shown). Vacuum line 188 is connected to vacuum pump 186 and to vacuum holes 192 in platen upper surface 42. In an example embodiment, vacuum holes 192 are formed near platen periphery 41. Substrate 50 is thus secured to platen 40 by a vacuum provided through holes 192. Securing substrate 50 to platen 40 is desirable to prevent unwanted movement of the substrate during the measurement process. In an example embodiment, vacuum pump 186 is coupled via line 194 to controller 80, which controls the operation of system 180.

Upper Optical System

With reference again to FIG. 1, upper optical system 66 includes a microscope objective 200. Microscope objective 200 is optically coupled to a detector 204, which is coupled to controller 80 via line 206. In an example embodiment, microscope objective and detector 200 constitute a video microscope 210.

In an example embodiment, detector 204 is a CCD array. Further in an example embodiment, CCD array is black and white. An example resolution of detector 204 is 512×408 pixels. Upper optical system 66 has a field viewing area FVA1 on the substrate and a corresponding detector viewing area DVA1 on the detector. In addition, microscope objective 200 has a numerical aperture NA1, a depth of field DOF1, a working distance WD1, a magnification M1, and an operating (viewing or imaging) wavelength λ1.

Table 1 below lists values for the above parameters for an example embodiment of upper optical system 66.

TABLE 1

Example parameter values for embodiment of upper optical system

| PARAMETER | VALUE |
| --- | --- |
| NA1 | 0.28 |
| DOF1 | +/− 6.4 microns |
| WD1 | 33.5 mm |
| λ1 | 0.5–1.0 microns |
| M1 | ~20 X |
| DVA1 | 5 mm × 5 mm |
| FVA1 | 250 × 250 microns |

In an example embodiment, microscope objective 200 is manually movable in the Z-direction via a focusing knob 214 coupled to a focusing mechanism 216 to bring upper optical system 66 into focus relative to substrate 50. In an example embodiment, focusing mechanism 216 is coupled directly to controller 80 via line 218 to provide for automatic focus control of upper optical system 66.

Also in an example embodiment, upper optical system 66 includes an illumination apparatus 240 comprising, for example, a light source 244 optically coupled to an optical system 246. In an example embodiment, light source 244 is a light-emitting diode. In an example embodiment, optical system 246 includes an optical fiber. Further in an example embodiment, optical system 246 includes a beamsplitter 248. Beamsplitter 248 is arranged along axis A1 in the optical path between substrate is frontside 52 and detector 204. In an example embodiment, beamsplitter 248 is arranged between microscope objective 200 and detector 204, as shown in FIG. 1.

In an example embodiment, the wavelength λ1 emitted by light source 244 is in the range between 500 and 1000 nm. Further in an example embodiment, light source 244 is coupled to controller 80 via line 250 for automated control of the illumination of substrate frontside 52.

In an example embodiment, upper optical system 66 is coupled to a stage 260 capable of moving the upper optical system in at least one of the X, Y, Z, $\theta_X$, $\theta_Y$ and $\theta_Z$ directions to position the upper optical system relative to stage assembly 18. Movement in the Z-direction allows upper optical system 66 to focus onto one or more of front-side alignment marks 60. Stage 260 may be moved manually in the X, Y, Z $\theta_X$, $\theta_Y$ and $\theta_Z$ directions via respective control knobs 268.

In an example embodiment, control knobs 268 have respective resolutions on the order of a tenth of a micron and 10 microradians. In an example embodiment, stage 260 is coupled to controller 80 via line 272 to provide for automatic control of the movement and positioning of upper optical system 66. In an alternate example embodiment, only the Z axis would have adjustment knobs, and a one-time alignment adjustment of the other degrees of freedom would be done with external tooling.

Lower Optical System

In an example embodiment, lower optical system 76 is the same as, or substantially the same as, upper optical system 66, described above.

With continuing reference to FIG. 1, lower optical system 76 includes a microscope objective 300 optically coupled to a detector 304, which is coupled to controller 80 via line 306. In an example embodiment, microscope objective 300 and detector 304 constitute a video microscope 310.

In an example embodiment, detector 304 is a CCD array. Further in an example embodiment, CCD array is black and white. An example resolution of detector 304 is 512×480 pixels. Lower optical system 76 has a field viewing area FVA2 on the substrate and a corresponding detector viewing area DVA2 on the detector. Microscope objective 300 has a numerical aperture NA2, a depth of field DOF2, a working distance WD2, a magnification M2, and an operating (viewing or imaging) wavelength λ2. In an example embodiment, lower optical system 76 has the same or substantially the same parameter values as those set forth above in Table 1 for upper optical system 66.

In an example embodiment, microscope objective 300 is movable in the Z-direction via a focusing knob 314 coupled to a focusing mechanism 316 to focus lower optical system 76. In an example embodiment, focusing mechanism 316 is coupled directly to controller 80 via line 318 to provide for automatic focus control of lower optical system 76.

Also in an example embodiment, lower optical system 76 includes an illumination apparatus 340 comprising, for example, a light source 344 optically coupled via an optical system 346. In an example embodiment, light source 344 is a light-emitting diode. In an example embodiment, optical system 346 includes an optical fiber. Further in an example embodiment, optical system 346 includes a beamsplitter 348. Beamsplitter 348 is arranged between microscope objective 300 and detector 304, as shown in FIG. 1. In an example embodiment, the wavelength λ emitted by light source 344 is in the range between 500 and 1000 nm. Light source 344 is coupled to controller 80 via line 350 to control the illumination of substrate backside 54.

In an example embodiment, lower optical system 76 is coupled to a stage 360 capable of moving the lower optical system in at least one of the X, Y, Z, $\theta_X$, $\theta_Y$ and $\theta_Z$ directions to position the lower optical system relative to stage assembly 18. Movement in the Z-direction allows lower optical system 76 to focus onto one or more of backside alignment marks 62. Stage 360 may be moved manually in the X, Y, Z $\theta_X$, $\theta_Y$ and $\theta_Z$ directions via respective control knobs 368.

In an example embodiment, control knobs 368 have respective resolutions on the order of a tenth of a micron and 10 microradians. In an example embodiment, stage 360 is coupled to controller 80 via line 372 to provide for automatic control of the movement and positioning of lower optical system 66.

In an alternate example embodiment, only the Z axis would have adjustment knobs, and a one-time alignment adjustment of the other degrees of freedom would be done with external tooling (not shown).

In another example embodiment, stage 360 simply serves as an immobile support that holds lower optical system fixed in space relative to stage assembly 18. In this example embodiment, the movement of stage assembly 18 in the Z-direction is used to provide focusing capability for lower optical system 76 to image backside alignment marks 62.

In an alternate example embodiment, the Z-direction adjustment is eliminated and the substrate backside surface is made to remain within the depth-of-focus of lower microscope 300 over the full travel of the stage.

Frontside and Backside Alignment Marks

With reference now to FIGS. 5A-5C and 6A-6C, there are shown two different example embodiments of frontside and backside alignment marks 60 and 62. In an example embodiment, frontside and backside alignment marks 60 and 62 are formed using standard photolithographic processes.

Further in an example embodiment, frontside alignment marks 60 are formed first on substrate frontside 52 of substrate 50 using standard photolithographic tools (not shown), and then the backside alignment marks 62 are formed on substrate backside 54 using the same photolithographic exposure tool. Almost any shape or type of alignment mark can be used, as long as the center of the mark is able to be determined. The alignment marks discussed immediately below are examples that differ from the frontside to the backside. Alternatively, the frontside and backside alignment marks can be the same shape and/or size.

Figure 5C:
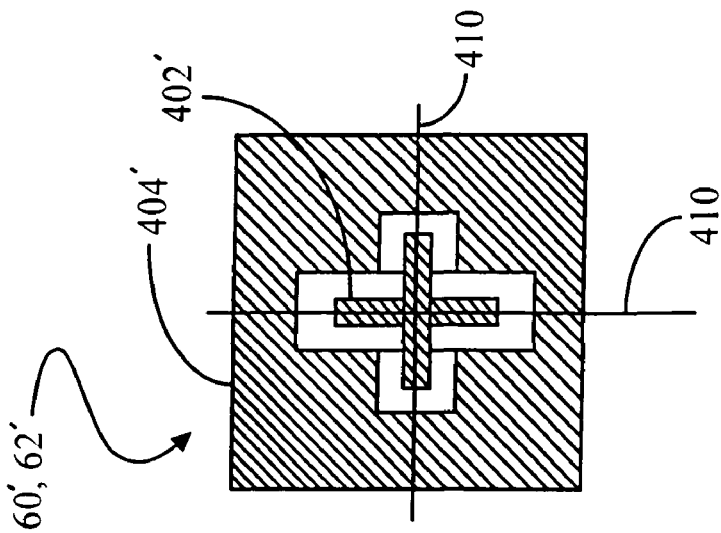
FIG. 5C is an example of superimposed images of the solid cross alignment mark of FIG. 5A and the hollow cross alignment mark of FIG. 5B as might appear on the display of the apparatus of FIG. 1.
Figure 5B:
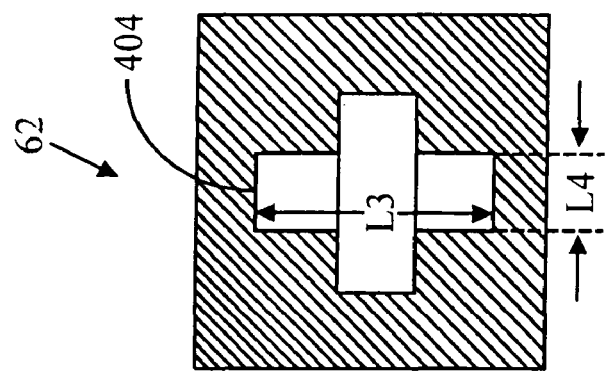
FIG. 5B is an example of an alignment mark in the form of hollow cross.
Figure 5A:
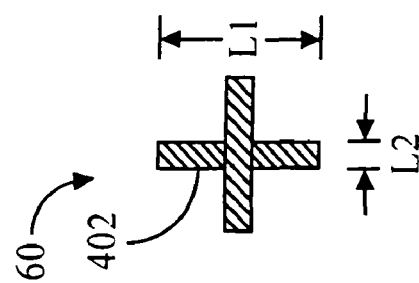
FIG. 5A is an example of an alignment mark in the form of a solid cross.

Thus, in one example embodiment, frontside alignment mark 60 is a solid cross 402 (FIG. 5A) with dimensions L1 and L2, while backside alignment mark 62 is a hollow cross 404 (FIG. 5B) with corresponding dimensions L3 and L4, which are slightly larger than dimensions L1 and L2. FIG. 5C illustrates the overlay of an image 402' of solid cross 402 from upper optical system 66 with an image 404' of hollow cross 404 from lower optical system 76, as might be displayed on display 84. In an example embodiment, cross-hairs 410 are optionally used to assist in aligning and determining the relative position of the two alignment marks.

In an example embodiment, dimension L1 is about 10 microns, and dimension L2 is about 2 microns. The alignment mark geometry illustrated in FIG. 5C is sometimes referred to as "cross in a cross". Generally, the polarity of alignment marks 60 and 62 can be either positive or negative. Further, alignment marks 402 and 404 can be used on either side of the substrate.

Figure 6C:
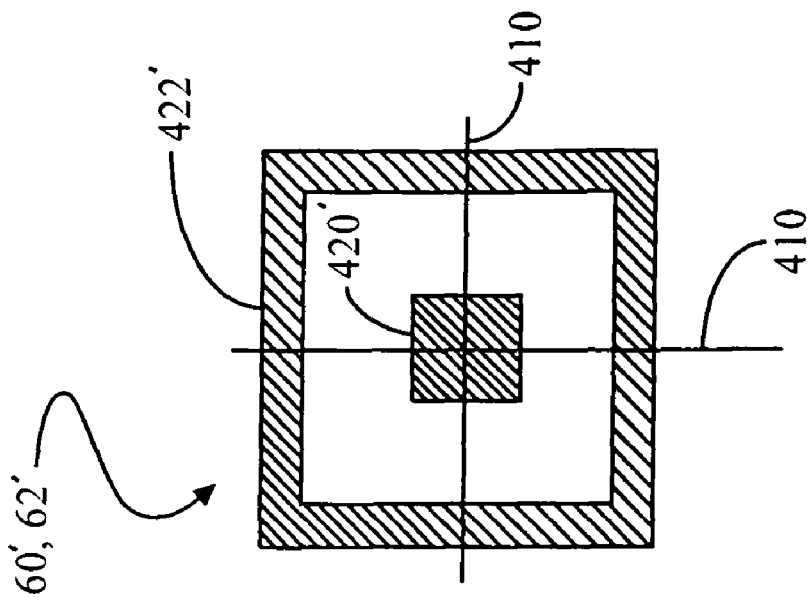
FIG. 6C is an example of superimposed images of the solid box alignment mark of FIG. 6A and the hollow box alignment mark of FIG. 6B, as might appear on the display of the apparatus of FIG. 1.
Figure 6B:
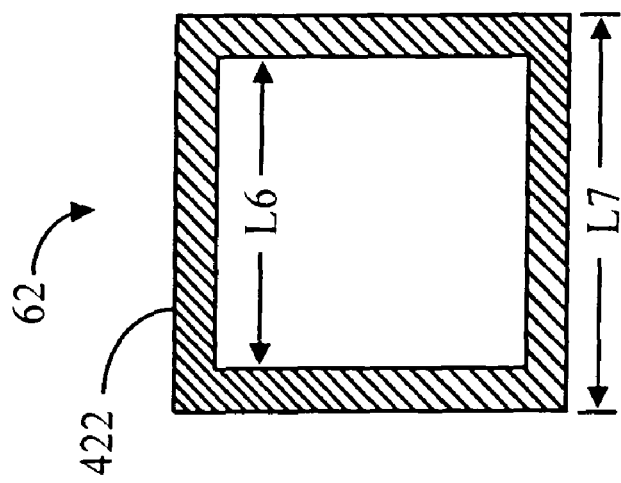
FIG. 6B is an example of an alignment mark in the form of hollow box.
Figure 6A:
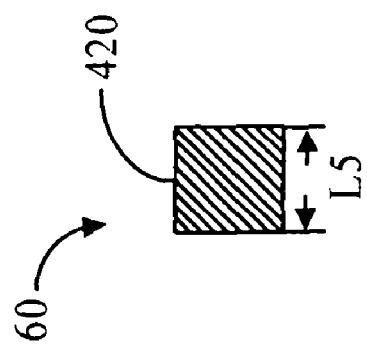
FIG. 6A is an example of an alignment mark in the form of a solid box.

In another example embodiment, frontside alignment mark 60 is a solid box 420 (FIG. 6A), while backside alignment mark 62 is a hollow box 422 (FIG. 5B) with dimensions somewhat larger than that of solid box 420. FIG. 6C illustrates the overlay of an image 420' of solid box 420 from upper optical system 66 with an image 422' of hollow box 422 from lower optical system 76 that might be displayed on display 84. In an example embodiment, cross-hairs 410 are optionally used to assist in aligning and determining the relative position of the two alignment marks.

In an example embodiment, solid box 420 and hollow box 422 are square. Further in the example embodiment, solid box 422 has a dimension L5 of about 10 microns and hollow box 592 has an inside dimension L6 of about 21 microns and an outside dimension L7 of about 23 microns. This alignment mark geometry is sometimes referred to as "box in a box". The polarity of alignment marks 60 and 62 can be either positive or negative, and the alignment marks can be used on either side of the substrate.

Controller and Software

With reference again to FIG. 1, in an example embodiment controller 80 includes a frame grabber 500 for capturing images from detectors 204 and 304. An example frame grabber 500 is a COGNEX™ 8120 frame grabbing board available from Cognex Corporation, Natick, Mass. Controller 80 further includes a microprocessor 502 and a memory unit 504, which is connected to the microprocessor by a bus 510. Memory unit 504 includes the ability to retrievably store data. In an example embodiment, memory unit 504 is capable of storing past alignment and/or overlay measurements, video images of alignment marks 60 and 62 (e.g., as bitmap files), and the like.

Controller 80 also includes a drive unit 512, such as a compact disk (CD) drive or a floppy drive, adapted to receive, read from and write to a computer-readable medium 514, such as a CD or a floppy disk.

Microprocessor 502 includes image-processing software that processes images of frontside and backside alignment marks 60 and 62 captured by frame grabber 500. In an example embodiment, frame grabber 500 and microprocessor 502 constitute a frame-grabbing board. The image processing software includes, in an example embodiment, one or more of the following features: Pattern training, target capture, target position measurement, video camera pixel calibration (x-scale, y-scale, x rotation, y rotation), top-to-bottom offset calibration, Z-travel calibration, top-to-bottom misregistration measurement, ability to log multiple measurements and/or images to memory, and ability to perform basic statistical calculations on multiple measurements. Example image processing software is known by the trademark PATMAX, which is available with the COGNEX 8120 frame grabber from Cognex Corporation.

Microprocessor 502 also includes software that embodies instructions for carrying out the methods for controlling the operation of apparatus 10. Such methods are described below.

In an example embodiment, controller 80 is a personal computer (PC) running an operating system, such as WINDOWS NT or WINDOWS 2000.

Display and Input Device

With continuing reference to FIG. 1, display 84 is used to display images of the front-side alignment marks 60 and backside alignment marks 62 as captured by upper and lower optical systems 66 and 76, respectively. In an example embodiment, display 84 is part of a cathode-ray tube (CRT) or a liquid crystal device (LCD) flat-panel.

Input device 86 is used to provide input information into controller 80 to operate and control apparatus 10. In an example embodiment, input device 86 includes a keyboard and/or a mouse. Input device 86 may also be included as part of display 84, e.g., as a touch-activated screen.

Methods of Calibration

As mentioned above, in an example embodiment, apparatus 10 is calibrated to obtain the most accurate and precise measurements of alignment and/or overlay. Calibration eliminates measurement errors, including tool-induced shift (TIS). The calibration includes ensuring that: (1) the linear Z-direction of travel of the upper and lower optical systems is true; (2) the upper and lower optical systems 66 and 76 are aligned relative to one another, i.e., that axes A1 and A2 are coaxial along the Z-direction and that the X and Y axes are aligned in rotation and the transverse measurement scale matches a known reference; and (3) that systematic residual errors from other system components are measured. The first calibration is referred to herein as "Linear Z-axis alignment", the second calibration is referred to herein as "optical system calibration" and the third calibration is referred to herein as "Tool Induced Shift" or "TIS". These three calibrations are now discussed in greater detail.

Linear Z-Axis Alignment

Figure 7:
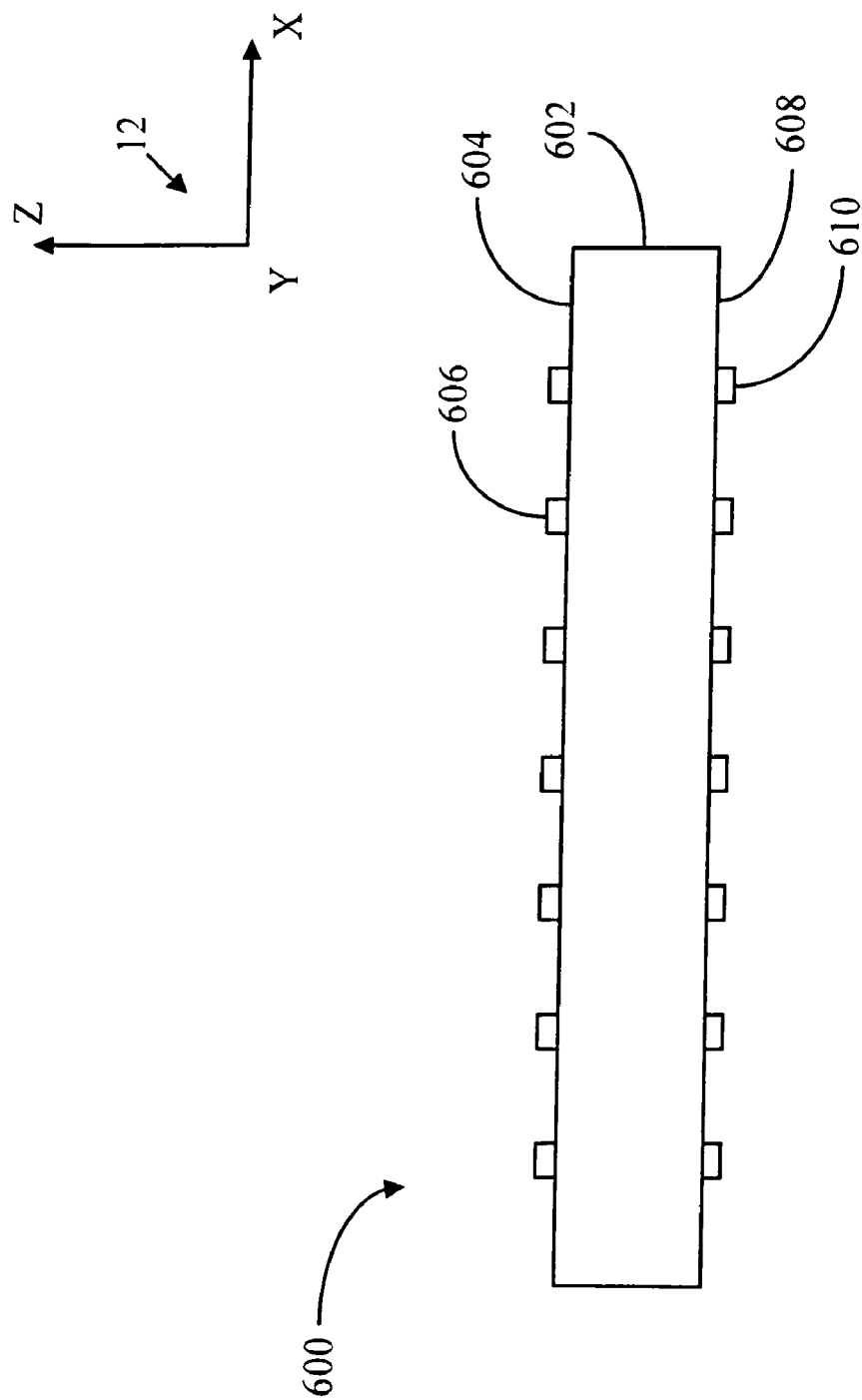
FIG. 7 is a cross-sectional view of an example of a linear Z-axis alignment tool.

FIG. 7 is a cross-sectional view of a linear Z-axis alignment tool 600 (hereinafter, "tool 600"). Tool 600 includes a substrate 602 having an upper surface 604 with upper surface targets 606, and a lower surface 608 with lower surface targets 610. In one example embodiment, upper surface targets 606 are the same as lower surface targets 610. Upper and lower surface targets 606 and 610 are aligned in the X and Y directions.

In an example embodiment, tool 600 is formed from two separate clear substrates (e.g., glass masks) that are first aligned with the upper and lower surface targets having the same (X,Y) coordinates in a plane parallel to lower surface 608, and then bonded together using, for example, optical cement.

With reference also to FIG. 1, tool 600 is placed on platen 40. In the embodiment where lower optical system 76 is fixed in space, upper optical system 66 is adjusted to image one of lower surface targets 610. The lower surface target image is then captured by frame grabber 500 and stored in memory unit 504. Upper optical system 66 is then moved in the Z-direction to image the corresponding upper surface target 606. The upper surface target image is then captured by frame grabber 500 and stored in memory unit 504. Tool 600 is then rotated 180° about axis A2 and the process is repeated.

Because upper and lower surface targets 606 and 610 have the same X and Y positions, any measured offset in X and Y between the target images is due to an X,Y deviation in the movement of the upper optical system as it travels in the Z-direction. The upper optical system can then be adjusted so that it travels directly along the Z-direction.

In the embodiment where lower optical system 76 is movable along the Z-direction, the above procedure is repeated using the lower optical system.

Optical System Calibration

Optical system calibration involves ensuring that axes A1 and A2 are coaxial. When performing a calibration using calibration fiducial 136 (FIG. 4), upper optical system 66 and lower optical system 76 are positioned so that each can view reference mark array 138 (FIG. 4). Then, reference mark array 138 is imaged with upper and lower optical systems 66 and 76, and the respective images captured. In one embodiment, the image processing software processes the two images and compares the locations of each of the reference marks to a reference position. Then one of the optical systems is moved (either manually or automatically) to compensate for any offset. Manual alignment of axes A1 and A2 can be performed by viewing the relative positions of the imaged reference marks on display 84 and moving one image with respect to another until they are overlayed. Once the position that eliminates or minimizes the offset is found, the upper optical system, say, is fixed. At this point, upper optical system 66 is allowed to move only in the Z-direction for focusing.

Besides serving to align the two optical systems, imaging the reference mark array 138 with the lower and upper optical systems is used to calibrate the co-ordinate system of each optical system so that the x-scale, y-scale, x rotation, and y rotation of detectors 204 and 304 is known accurately.

Tool Induced Shift

Once the linear Z-axis and optical systems calibrations are performed, the Tool Induced Shift (TIS) can be measured and stored.

With reference also to FIG. 3, calibration fiducial 136 is used for this calibration.

One of the reference marks 140 is then imaged by lower optical system 76, captured by frame grabber 500 and its target position is stored in memory unit 504. The same reference mark 140 is then imaged by upper optical system 66 and captured by frame grabber 500 and its target position is stored in memory unit 504. Calibration fiducial 136 is then rotated 180° about axis A2 and the process is repeated.

Residual misalignment between corresponding lower and upper optical systems 76 and 66 can be estimated by subtracting the measurements taken at 0° and 180° and dividing by two. The misalignment is a function of residual errors from pixel calibration and linear Z-axis calibration.

Also included in this value will be XY errors due to stage tip and tilt, indicating that there may be dependency between the 115 value and the position of stage assembly 18. Therefore to obtain the highest accuracy it is necessary to perform a TIS calibration over an array of stage positions.

This information, stored in memory unit 504 can be used to automatically cancel residual systematic error for all subsequent measurements, eliminating the need to perform a TIS measurement on a field-by-field basis.

Measurement Methods

Once apparatus 10 is calibrated, then a particular substrate 50 can be measured. In an example embodiment, measurements are performed on a field-by-field basis, rather than relying on a limited number of measurements at widely separated points on the substrate, as is common in the prior art. Thus, in example embodiments of the measurement methods of the present invention, tens to hundreds of frontside-to-backside alignment measurements are taken per substrate. Measurements are taken at different points on the substrate by moving stage assembly 18 so that select substrate locations are sequentially arranged between upper and lower optical systems 66 and 76.

In an example embodiment, each measurement compares the position of one or more frontside alignment mark 60 to one or more corresponding backside alignment marks 62. Further in the example embodiment, the position (X1, Y1) of one frontside alignment mark 60 is compared to the position (X2, Y2) of a corresponding backside alignment mark 62.

Figure 8:
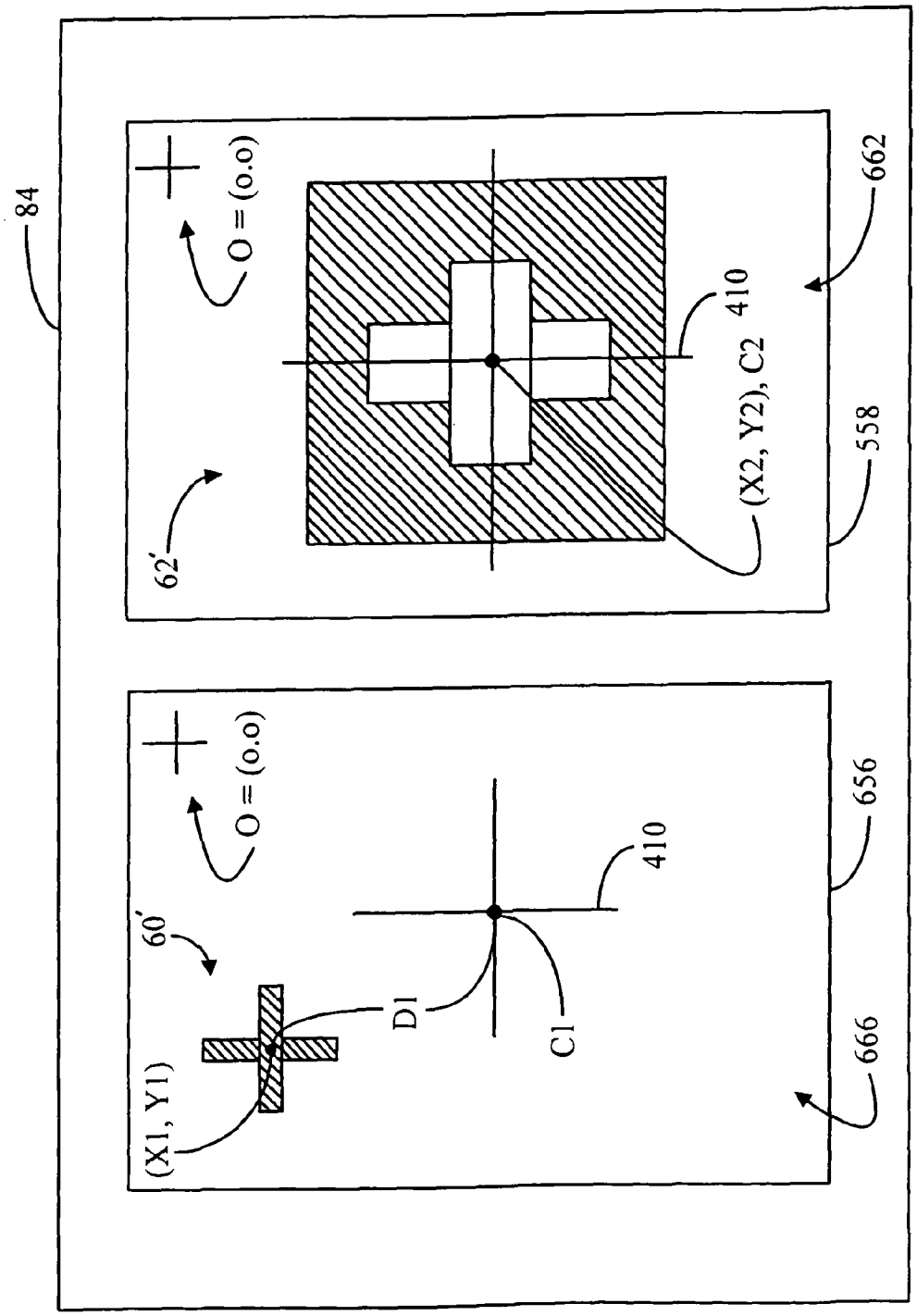
FIG. 8 shows images of frontside and backside alignment marks as might appear in two separate windows on a display of the apparatus of FIG. 1.

FIG. 8 shows images 60' and 62' of frontside and backside alignment marks 60 and 62 as might appear in two separate windows 656 and 658 on display 84. In an is example embodiment, the X,Y location (X1, Y1) for a select frontside alignment mark 60 relative to an origin 0 (i.e., reference point (X1=0, Y1=0) is determined by capturing image 60' of a frontside alignment mark 60 using the image processing software in microprocessor 502 of controller 80.

Likewise, the X,Y location (X2, Y2) for a select backside alignment mark 62 relative to the same common origin 0 is determined by capturing an image 62' of the backside alignment mark and establishing its location (X2, Y2) relative to origin 0 using the image processing software. The offset between the marks relative to common origin 0 is then determined by a straightforward calculation, e.g., $\Delta X=(X1-X2)$ and $\Delta Y=(Y1-Y2)$. In an example embodiment, the calculation is performed in microprocessor 502.

In another example embodiment, image 62' of a backside alignment mark 62 is centered at a point C2 in the field of view 662 of lower optical system 76 by moving stage assembly 18. Then, an offset D1 between frontside alignment mark 60 and center C1 of the field of view 666 of upper optical system 66 (as indicated by cross-hairs 410) is established. This may be accomplished, for example, by automatically or manually moving stage assembly 18 so that frontside alignment mark image 60' is centered in field of view 666 of the upper optical system, and recording the displacement D1 from the original position (X1, Y1).

In another example embodiment, respective images 60' and 62' are displayed together on display 84 in the same window, as illustrated in FIGS. 5C and 6C, so that the offset is determined by the amount of movement needed to overlap images 60' and 62'.

In an example embodiment, the alignment measurement data for each set of frontside and backside alignment marks is stored in memory unit 504. Once the measurement data for the desired number of sites has been collected, the data is processed by controller 80 (e.g., by microprocessor 502 therein). The data processing includes, for example, listing the displacement values ($\Delta X$, $\Delta Y$) for each site, and calculating the average and the standard deviation for displacement values.

An advantage of performing more than just a few measurements per substrate is that enough data can be taken to ascertain the root causes of any alignment and/or is overlay errors, such as from mask run-out, coating non-uniformities, substrate non-flatness, and grid errors. The ability to characterize and quantify alignment and/or overlay is important in modern semiconductor manufacturing because it allows one to redress the source of the errors to improve tool performance, and improved tool performance generally leads to improved semiconductor device performance.

Table-Top Apparatus Embodiment

Figure 9:
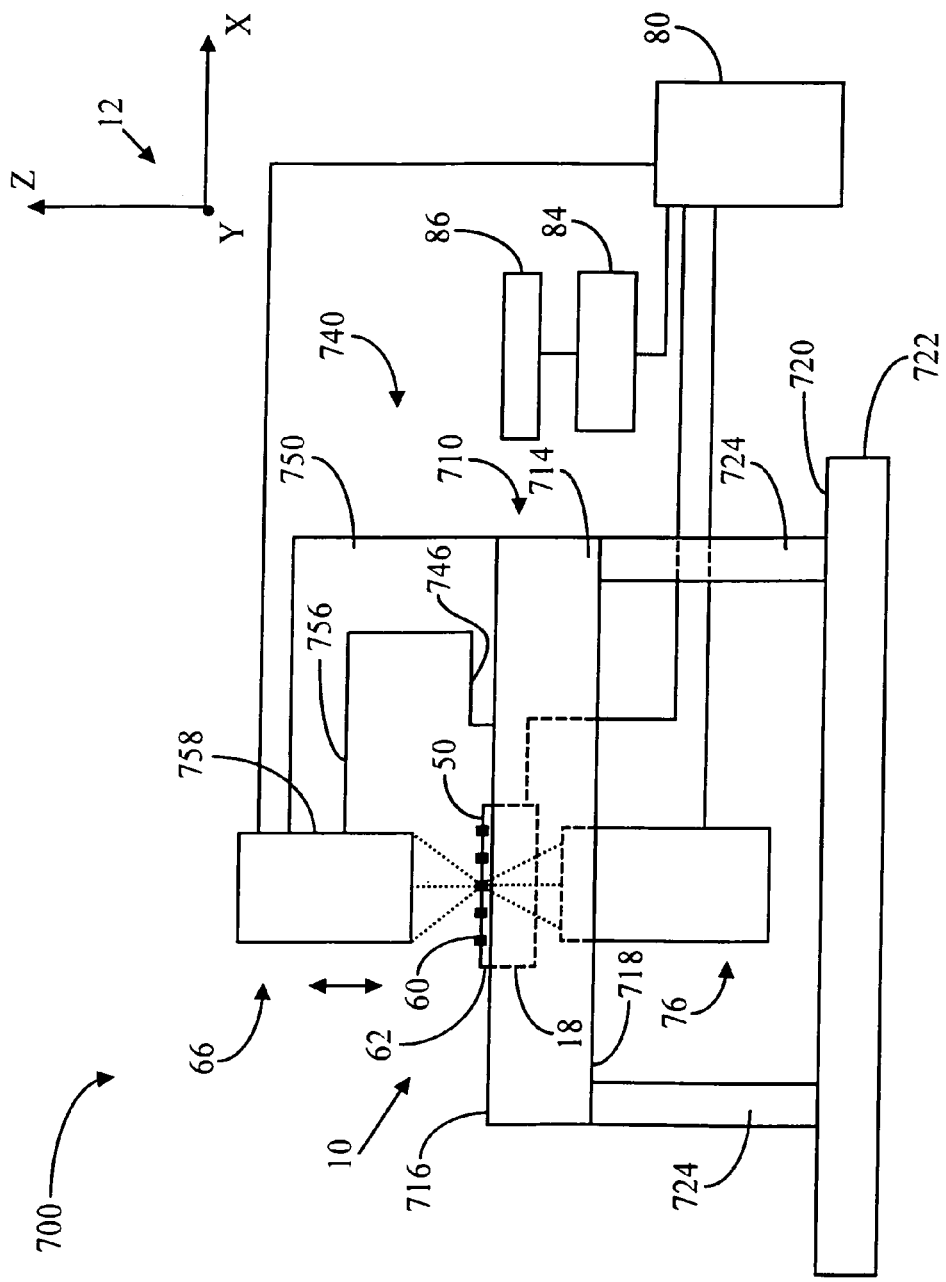
FIG. 9 is an example embodiment of a table-top measurement apparatus incorporating the dual-sided alignment metrology apparatus of FIG. 1.

FIG. 9 is side view of a table-top apparatus 700 that includes dual-sided alignment metrology apparatus 10 of FIG. 1. System 700 includes a support frame 710 having a horizontal support member 714 with an upper surface 716 and a lower surface 718. Horizontal support member 714 is supported above a surface 720 of a table 722 by legs 724 connected to the horizontal support member, e.g., at lower surface 718. Table 722 is, in an example embodiment, an isolation table of the kind typically used for high-magnification microscopes. Stage assembly 18 is supported by horizontal support member 714. In example embodiments, stage assembly 18 is supported on or within upper surface 716.

Apparatus 700 includes a support pedestal 740. In an example embodiment, support pedestal 740 has a base 746, a vertical columnar portion 750 extending upward from the base, and a support arm 756 extending horizontally from the vertical column. Support arm 756 has an end 758 to which upper optical system 66 is movably attached.

Base 746 of support pedestal 740 is supported by upper surface 716 of horizontal support member 714 such that upper optical system 66 is supported over stage assembly 18. Lower optical system 76 is attached to horizontal support member 714 beneath stage assembly 18 so as to be in optical communication with stage assembly 18, and in particular to a substrate 50 when placed thereon.

In an example embodiment, upper and lower optical systems 66 and 76, as well as stage assembly 18, are coupled to controller 80. In an example embodiment, display 84 and input device 86 are located close to apparatus 700 (not shown) so that a person operating apparatus 700 can view images of frontside and backside alignment marks 60 and 62 shown on the display, as well as any other information relating to the measurement of substrate 50.

The various elements depicted in the drawings are merely representational and are not drawn to scale. Certain proportions thereof may be exaggerated, while others may be minimized. The drawings are intended to illustrate various implementations of the invention, which can be understood and appropriately carried out by those of ordinary skill in the art.

While certain elements have been described herein relative to "upper" and "lower", "horizontal" and "vertical", and "above" and "below", it will be understood that these descriptors are relative, and that they could be reversed if the elements were inverted, rotated, or mirrored. Therefore, these terms are not intended to be limiting.

In the foregoing Detailed Description, various features of the invention are grouped together in various example embodiments for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

The many features and advantages of the present invention are apparent from the detailed specification, and, thus, it is intended by the appended claims to cover all such features and advantages of the described apparatus that follow the true spirit and scope of the invention. Furthermore, since numerous modifications and changes will readily occur to those of skill in the art, it is not desired to limit the invention to the exact construction and operation described herein. Accordingly, other embodiments are within the scope of the appended claims.

What is claimed is:

1. A method of measuring a substrate having a frontside with frontside alignment marks and a backside with backside alignment marks, comprising:
    capturing a first image of a select frontside alignment mark with a first optical system arranged adjacent the frontside;
    capturing a second image of a select backside alignment mark with a second optical system arranged adjacent the backside and aligned relative to the first optical system; and
    processing the first and second images to determine a lateral offset between the select frontside and backside alignment marks.

2. The method of claim 1, wherein the processing includes determining respective center positions for each of the select frontside and backside alignment marks.

3. The method of claim 2, wherein the processing further includes determining a distance between the center positions.

4. The method of claim 1, including performing a calibration to ensure that the first and second optical systems are aligned relative to one another.

5. The method of claim 1, including performing a calibration to ensure that at least one of the first and second optical systems is movable in a direction normal to a plane defined by the substrate.

6. The method of claim 1, including storing residual systematic offsets in a memory unit.

7. The method of claim 1, including displaying at least one of the first and second images.

8. The method of claim 1, further including manually adjusting the stage assembly to center the frontside and backside alignment marks with respect to the upper and lower optical systems, respectively.

9. The method of claim 1, further including automatically adjusting the stage assembly with a controller.

10. The method of claim 1, further including forming third and fourth images of the select frontside and backside alignment marks, respectively, at an orientation 180° relative to that of the first and second images to measure tool induced shift (TIS).

11. The method of claim 1, further including aligning the first and second optical systems to each other by imaging, with the first and second optical systems, an array of reference marks on a calibration fiducial arranged between the first and second optical systems.

12. The method of claim 1, further including measuring respective magnifications of the first and second optical systems to determine an absolute scale by imaging, with the first and second optical systems, an array of reference marks on a calibration fiducial arranged between the first and second optical systems.

13. The method of claim 1, further including measuring respective rotations of the first and second optical systems, to determine an absolute rotation by imaging, with the first and second optical systems, an array of reference marks on a calibration fiducial arranged between the first and second optical systems.

14. A method, comprising:
    positioning a substrate having a frontside with frontside alignment marks and a backside with backside alignment marks between upper and a lower optical systems in optical communication with the frontside and backside, respectively;
    capturing first and second images of a select frontside alignment mark and a select backside alignment mark; and
    processing the first and second images to determine an offset between the select frontside alignment mark and the select backside alignment mark.

15. The method of claim 14, wherein the processing includes processing the captured images to determine respective centers of each of the select frontside and backside alignment marks.

16. The method of claim 14, wherein prior to positioning the substrate, further including the step of capturing first and second images of reference marks on a calibration fiducial to align the first and second optical systems and measure a residual systematic offset.

17. The method of claim 14, wherein prior to positioning the substrate, further including capturing first and second images of reference marks on a calibration fiducial to measure the magnification and rotation of the first and second optical systems to determine a measurement scale and relative rotation.

18. The method of claim 14, wherein prior to positioning the substrate, further including capturing first and second images of reference marks on a Z axis alignment tool to measure a change in X and Y offset of the first optical system relative to the second optical system over a range of focus of the first optical system.

19. The method of claim 14, including storing measurements of residual systematic offsets as a function of stage X and Y position, offsets as a function of Z focus position, and scale and rotation of the optical systems, and determining an absolute displacement between each of the select frontside and backside alignment marks.

20. The method of claim 14, including performing the acts recited therein for any select pairs of frontside and backside alignment marks at any location on the substrate without rotating the substrate to measure tool induced shift (TIS).

21. The method of claim 14, including displaying at least one of the first and second images on a display.

22. The method of claim 14, including performing the acts recited therein for two or more pairs of frontside and backside alignment marks.

23. The method of claim 14, including performing statistical analysis on any number of displacement measurements on select frontside and backside alignment marks and displaying the results.

* * * * *